United States Patent [19]

Asbeck et al.

[11] Patent Number: 4,785,457
[45] Date of Patent: Nov. 15, 1988

[54] HETEROSTRUCTURE SEMICONDUCTOR LASER

[75] Inventors: Peter M. Asbeck, Newbury Park; David L. Miller, Thousand Oaks, both of Calif.

[73] Assignee: Rockwell International Corporation, El Segundo, Calif.

[21] Appl. No.: 48,359

[22] Filed: May 11, 1987

[51] Int. Cl.$^4$ .............................................. H01S 3/19
[52] U.S. Cl. ...................................... 372/45; 372/46
[58] Field of Search ...................... 372/43, 44, 45, 46; 357/17

[56] References Cited

U.S. PATENT DOCUMENTS

| 4,392,227 | 7/1983 | Itoh et al. | 372/46 |
| 4,456,999 | 6/1984 | Sugino et al. | 372/45 |
| 4,599,787 | 7/1986 | Sasatani | 372/46 |

FOREIGN PATENT DOCUMENTS

| 0239081 | 11/1985 | Japan | 372/46 |
| 0258992 | 12/1985 | Japan | 372/46 |

OTHER PUBLICATIONS

Ballingall, et al., "Crystal Orientation Dependence of Silicon...", Appl. Phys. Lett., vol. 41, p. 947, Nov. 15, 1982.
Wang, et al., "Crystal Orientation Dependence of Silicon Doping in ...", Appl. Phys. Lett., vol. 47, p. 826, Oct. 15, 1985.
Z. Rav-Noy, et al., "Vertical Field-Effect Transistors in III-V Semiconductors", Appl. Phys. Lett., vol. 45, p. 258, Aug. 1, 1984.
Miller, "Lateral p-n Junction Formation in GaAs Molecular ...", Appl. Phys. Lett., vol. 47, p. 1309, Dec. 15, 1985.
Miller, "Summary Abstract: Lateral p-n Junction Formation in GaAs ...", J. Vac. Sci. Technol., vol. B4, p. 655, Mar./Apr. 1986.

Primary Examiner—William L. Sikes
Assistant Examiner—Georgia Y. Epps
Attorney, Agent, or Firm—H. Fredrick Hamman; Craig O. Malin

[57] ABSTRACT

The crystallographic plane-dependent, amphoteric nature of Si-doped AlGaAs is used to provide a low threshold semiconductor laser. An active layer of AlGaAs is sandwiched between an injection layer and a current confining layer of AlGaAs. The injection layer is doped to be n-type conductivity. The confining layer is amphoterically doped with Si to be n-type in a (100) plane and p-type in a (111)A plane. The resulting p-n junctions, heterostructure, and geometry provide the current and the optical confinement for the semiconductor laser.

15 Claims, 2 Drawing Sheets

HETEROSTRUCTURE SEMICONDUCTOR LASER

BACKGROUND OF THE INVENTION

This invention relates to the field of lasers and particularly to a heterostructure semiconductor laser.

There are many different types of semiconductor lasers that can provide an optical output beam. These include injection lasers, crowding effect lasers, stripe-geometry lasers, heterostructure lasers, and others. Of these types, the heterostructure laser based upon confining layers of different compounds, such as GaAs and AlGaAs, shows particular promise.

There are many promising applications for semiconductor lasers, particularly in optical fiber communications and in integrated optoelectronics. These applications require lasers which have a low threshold voltage, a circular far field pattern, and which are fast, efficient, reliable, and longevous. Additionally, the laser should be producible using manufacturing methods which are compatible with other devices in the circuit and which can economically provide reproducible results.

SUMMARY OF THE INVENTION

It is an object of the invention to provide an improved semiconductor laser.

It is an object of the invention to provide a semiconductor laser having a low threshold voltage.

It is an object of the invention to provide a semiconductor laser having a circular far field pattern.

It is an object of the invention to provide a semiconductor laser using economical and reliable manufacturing methods.

According to the invention, the crystallographic plane-dependent amphoteric nature of Si-doped AlGaAs is used to provide a low threshold semiconductor laser. Using an epitaxial growth process such as molecular beam epitaxy (MBE) or metal organic chemical vapor deposition (MOCVD), an active layer of GaAs is sandwiched between confining layers of AlGaAs. One of the confining layers is doped to be n-type conductivity. The other confining layer is doped with Si to be n-type in a (100) plane and p-type in a (111) plane. The resulting p-n junctions, heterostructure, and geometry provide the current confinement and the optical confinement required for the semiconductor laser.

These and other objects and features of the invention will be apparent from the following detailed description taken with reference to the accompanying drawings.

DESCRIPTION OF THE PREFERRED EMBODIMENT

Some dopants such as Si and Ge exhibit amphoteric doping in III-V semiconductor compounds. For example, when GaAs is suitably doped with Si, it has n-type conductivity in (100) crystallographic planes and p-type conductivity in (111)A crystallographic planes. U.S. patent application Ser. No. 932,239 by Miller and Asbeck (also joint inventors in this application) describes a lateral bipolar transistor which takes advantage of this phenomena. In this application, the same phenomena is used to provide current confinement in a heterojunction semiconductor laser.

Figure 1:
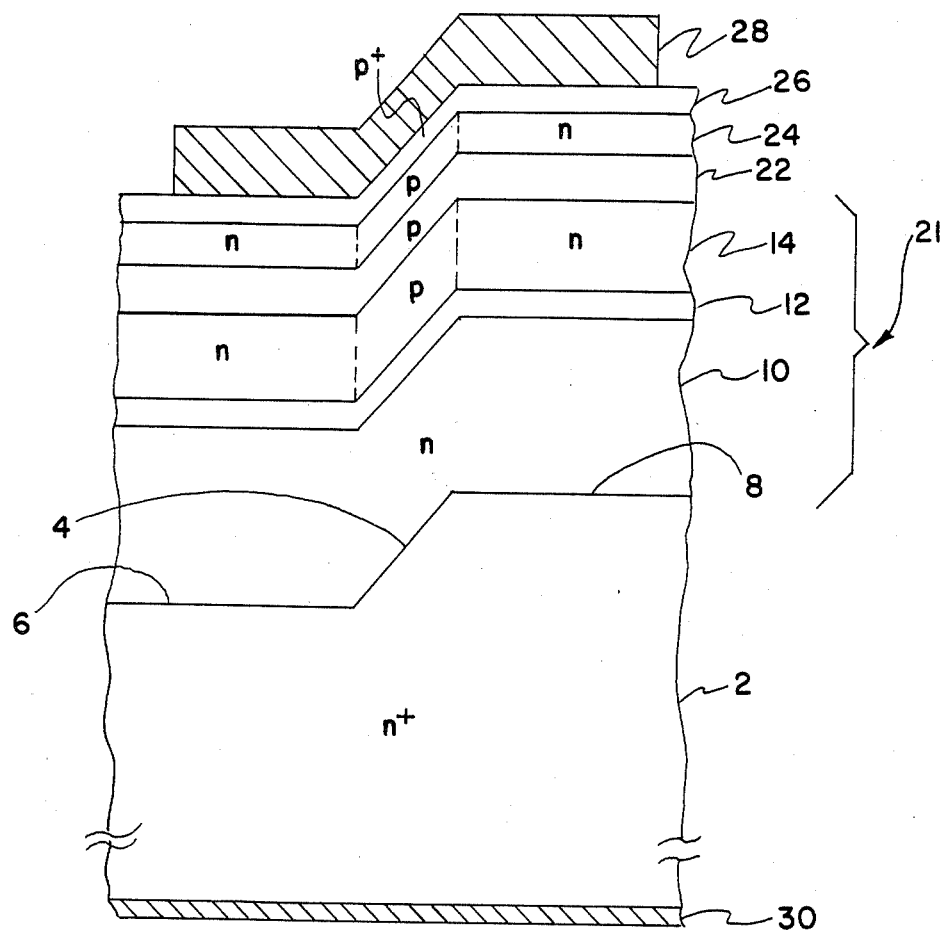
FIG. 1 is a cross sectional view of a semiconductor laser illustrating the structure of the invention.

As shown in FIG. 1, semi-insulating GaAs substrate 2 has been patterned using photoresist and wet chemical etching to produce a 2 μm wide (111)A stripe 4 joining two (100) planes 6, 8. Alignment of photoresist stripes along the appropriate [011] direction and use of the crystallographic-plane-selective etchant $H_3PO_4:H_2O_2$ (1:10) resulted in (111)A ramps 4 between the large (100) areas 6, 8. After completing the plane-selective etching of substrate 2, the photoresist is removed and the injectin, confining, and active layers are deposited using known molecular beam epitaxy (MBE) growth processes.

Injection layer 10 is AlGaAs of sufficient thickness to provide optical and electrical confinement; 1.9 μm was used in this embodiment. As defined in the art, the compound AlGaAs encompasses different compounds having different quantities of Al. This is sometimes expresses as $Al_xGa_{1-x}As$, where x is less than 1. In the illustrated example, the compound forming injection layer 10 is $Al_{0.3}Ga_{0.7}As$ and it is doped with Si ($8 \times 10^{17}$ $cm^{-3}$), although other amphoteric dopants and concentrations can be used. This layer is n-type material in both the (100) and (111)A planes to provide the n-type injecting region of the double heterostructure diode. The plane-selective doping effect which would otherwise have produced p-type AlGaAs on the (111)A surface, was overcome during fabrication by using a relatively low substrate temperature of 580° C. (or 850 K) and a high arsenic to gallium flux pressure ratio. These conditions reduce the tendancy of the amphoteric dopant Si to reside on sites of the GaAs crystal lattice normally occupied by arsenic, where Si would behave as an acceptor; and increase the tendancy of Si to reside on sites of the GaAs crystal lattice normally occupied by gallium, where Si would behave as a donor. In this example, both $As_2$ and $As_4$ were used from two ovens. The beam pressure ratio as measured with a movable ion gage in the Varian Gen II MBE machine was 10:1 for the $As_2$ and 18:1 for the $As_4$. This combination of low substrate temperature and high ratio of arsenic to gallium is sufficient to drive the n-type condctivity of the Si-doped $Al_{0.3}Ga_{0.7}As$ (100) layer 10 into the (111)A region.

Active layer 12 is grown on injection layer 10. This is a thin (less than about 0.3 um) layer of undoped AlGaAs grown at a substrate temperature of about 670° C. It may be GaAs or an AlGaAs compound. When the formula AlGaAs is used, it is to be understood that the ratio of Al to Ga can vary as is known in the art to obtain both the desired active layer 12 and the heterojunctions between the active layer 12 and the adjacent layers 10, 14.

Figure 2:
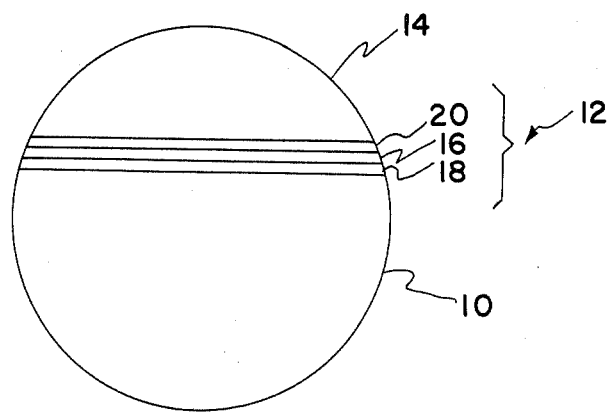
FIG. 2 is a cross sectional view of a portion of a semiconductor laser illustrating a multi-quantum well active layer embodiment of the invention.

As shown in FIG. 2, active layer 12 can be a multi-quantum well structure of GaAs 16 between layers 18 and 20 of AlGaAs. In this example, each of the three layers is about 0.1 μm thick and the AlGaAs layers 18, 20 have a composition of $Al_{0.3}Ga_{0.7}As$.

Current confinement is accomplished by growing an AlGaAs npn layer 14 on active layer 12. In this example, current confinement layer 14 is $Al_{0.3}Ga_{0.7}As$, it is amphoterically doped with Si ($8 \times 10^{17}$ cm$^{-3}$), and it has a thickness of about 0.9 um. A substrate temperature of 670° C. and a ratio of As flux to Ga flux of 18:1 is used to obtain plane-selectively doped npn regions on the (100), (111)A, and (100)A planes as shown in FIG. 1. The p-type channel thus obtained provides a current path for injection of holes though the blocking npn region. Active layer 12 sandwiched between confining layers 10 and 14 comprise a double heterostructure light emitting diode 21 of the laser.

Additional current blocking layers 22, 24 are grown on current confinement layer 14. As shown in FIG. 2, layer 22 is 0.5 um thick and is doped with Be ($6 \times 10^{17}$ cm$^{-3}$) to be completely p-type conductivity. Layer 24 is a 0.5 um thick layer which is amphoterically doped with Si ($8 \times 10^{17}$ cm$^{-3}$) to have plane dependent npn-type conductivity like current confining layer 14. Both blocking layers have a composition of Al$_{0.3}$Ga$_{0.7}$As.

The semiconductor structure is completed by capping it with a heavily Be doped ($5 \times 10^{18}$ cm$^{-3}$) p+ GaAs contact layer 26 at 580° C., and by depositing metal contacts 28, 30.

Figure 3:
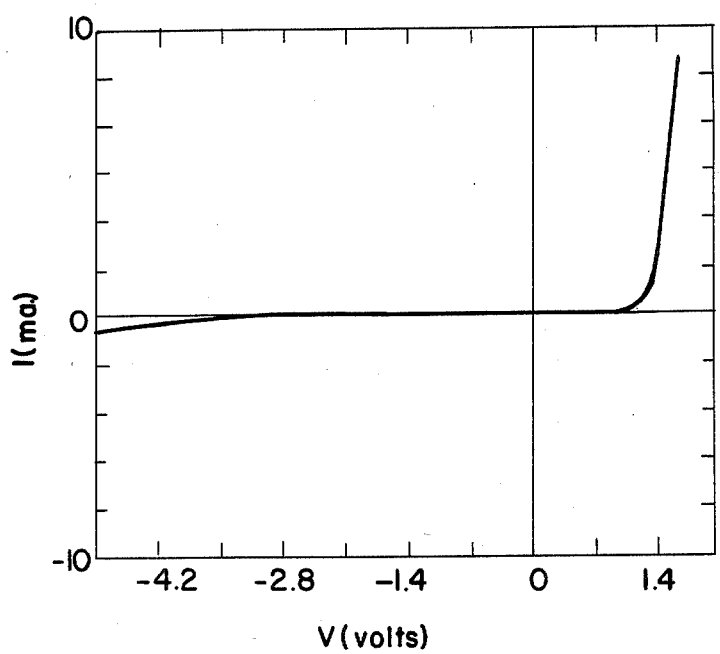
FIG. 3 is a curve showing the current-voltage characteristics of the light-emitting diode portion of the laser.

The current-voltage characteristic of the diode 21 formed by injectin layer 10, active layer 12, and current confinement layer 14 is shown in FIG. 3. Reverse breakdown occurred near −5 v. The forward characteristic had an ideality factor of 3. The series resistance for diodes which had an active area of 0.7 mm×2 um ($1.4 \times 10^{-5}$ cm$^2$) was about 10 ohms. If this series resistance resulted primarily from the 1.4 um total thickness of p-type plane-selectively doped AlGaAs material current confining and blocking layers 14, 24, the AlGaAs resistivity must have been about 1 ohm-cm. For a mobility of 50 cm$^2$/v-sec, this implies a p-type doping density of about $1 \times 10^{17}$/cm$^3$ in the plane selectively doped AlGaAs. This can be compared to the nominal Si density of $8 \times 10^{17}$/cm$^3$.

Figure 4:
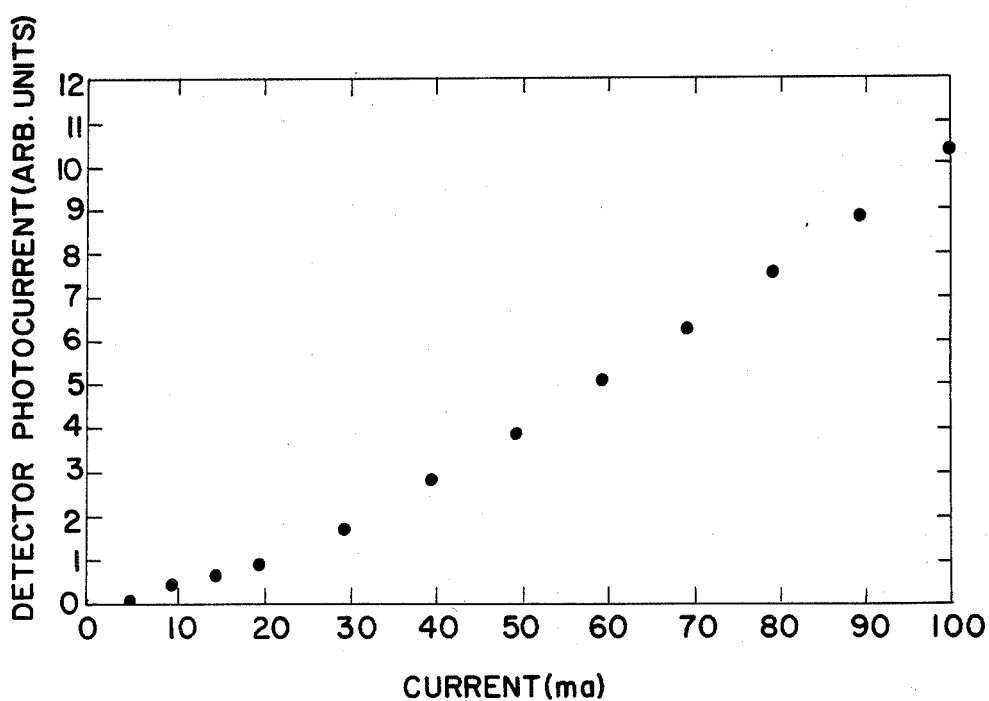
FIG. 4 is a plot of diode current vs detector photocurrent of the light-emitting diode portion of the laser.

Light output was observed in the near infrared from diode 21. The optical output was localized in a small region under the ramped (111)A portion of active layer 12. Light output as a function of diode current is shown in FIG. 4. The optical output was $1 \times 10^{-3}$ uW/ma, for 0.7 mm long diodes; longer diodes had lower efficiency. For these measurements, the detector subtended a solid angle of about 0.23 steradians as seen from the diode.

Construction of a laser using light from light emitting diode 21 can be accomplished using known principles. Current confinement is obtained using the AlGaAs lateral p-n junction (between confining layer 14 and injection layer 10) as described above. Lateral optical confinement is provided by changes in the refractive index at the heterojunctions on both sides of active layer 12 and by the abrupt bends between the (100) plane and the (111)A plane in active layer 12. These bends reflect light back into the optical cavity assisting the lasing action. Reflecting mirrors perpendicular to the (111)A stripe would be formed according to known principles to complete the optical cavity.

Because the molecular beam epitaxy (MBE) growth method described above is a single-step method, the laser can be more easily fabricated than prior art semiconductor lasers which use two-step methods. Other single-step growth methods such as liquid phase epitaxy (LPE) and organometallic vapor phase epitaxy (OMVPE) can also be used. These methods offer a simple way to confine both the injected carriers and the optical mode to lateral dimensions of 1 um or less. This tight dimensional confinement is the key to providing low threshold current in a laser. Additionally, this structure should provide lasers having a more circular far-field pattern than prior art structures.

Numerous variations can be made without departing from the invention. For example, the current confinement layer can be grown on a p-type substrate below the active layer. Different crystallographic planes and geometry can be used. Semiconductor compounds such as (InAl)As, (InGa)As, InP, and (GaAl)As, and dopants such as Ge can be used provided that they exhibit the necessary crystal-plane-dependent doping effect. Accordingly, it should be understood that the form of the invention described above is illustrative and is not intended to limit the scope of the invention.

What is claimed is:

1. In a semiconductor laser:
   an epitaxial active layer of a semiconductor;
   an epitaxial injection layer of a semiconductor on one side of the active layer;
   an epitaxial confinement layer of a semiconductor on the other side of the active layer having a dopant that provides a first conductivity in first crystallographic planes and an opposite conductivity in second crystallographic planes having a different orientation, the confinement layer having a first portion which lies within the first crystallographic planes and another portion which lies within the second crystallographic planes on both sides of the first portion whereby current across the active layer can be confined to the first portion by the change in conductivity type of the confinement layer; and
   means for making electrical contact to the injection layer and to the confinement layer.

2. The semiconductor laser as claimed in claim 1 including an epitaxial semiconductor substrate adjoining the injection layer.

3. The semiconductor laser as claimed in claim 1 including an epitaxial semiconductor substrate adjoining the confinement layer.

4. The semiconductor laser as claimed in claim 2 wherein the means for making electrical contact comprises an epitaxial cap layer on the confinement layer and a metal contact on the cap layer, and a metal contact on the substrate.

5. The semiconductor laser as claimed in claim 3 wherein the means for making electrical contact comprises an epitaxial cap layer on the confinement layer and a metal contact on the cap layer, and a metal contact on the substrate.

6. The semiconductor laser as claimed in claim 1 wherein the semiconductor is a III-V compound semiconductor.

7. The semiconductor laser as claimed in claim 6 wherein the dopant is Si.

8. The semiconductor laser as claimed in claim 6 wherein the dopant is Ge.

9. In a semiconductor laser:
   an epitaxial active layer of AlGaAs;
   an epitaxial injection layer of AlGaAs doped to be n-type conductivity on one side of the active layer;
   an epitaxial confining layer of AlGaAs on the other side of the active layer, the confining layer being amphoterically doped with Si and having an n-type conductivity portion in a (100) crystallographic plane and a p-type conductivity portion in a (111)A crystallographic plane, the n-type portion confining the p-type portion to a strip within the confining layer; and means for making electrical contact to the injection layer and to the confining layer, whereby current across the active layer can be confined by the p-type conductivity portion of the Si-doped confining layer.

10. The semiconductor laser as claimed in claim 9 including an epitaxial GaAs substrate adjoining the n-type conductivity injection layer.

11. The semiconductor laser as claimed in claim 9 including a GaAs substrate adjoining the amphoterically Si-doped confining layer.

12. The semiconductor laser as claimed in claim 10 including: an epitaxial current blocking layer on the amphoterically Si-doped confining layer; and an epitaxial cap layer on the current blocking layer.

13. The semiconductor laser as claimed in claim 12 wherein the current blocking layer comprises a p-type conductivity layer of AlGaAs and a second AlGaAs layer amphoterically doped with Si on the p-type conductivity layer of AlGaAs.

14. The semiconductor laser as claimed in claim 12 wherein the cap layer comprises a $p^+$-type conductivity layer of GaAs, and wherein the means for making electrical contact comprises a metal contact on the cap layer and a metal contact on the substrate.

15. The semiconductor laser as claimed in claim 9 wherein the active layer comprises a GaAs/AlGaAs multi-quantum well structure.

* * * * *